(12) United States Patent
Nagasaka

(10) Patent No.: US 7,547,151 B2
(45) Date of Patent: Jun. 16, 2009

(54) OPTICAL MODULE PACKAGE AND OPTICAL MODULE

(75) Inventor: Kimio Nagasaka, Hokuto (JP)

(73) Assignee: Seiko Epson Corporation (JP)

(*) Notice: Subject to any disclaimer, the term of this patent is extended or adjusted under 35 U.S.C. 154(b) by 0 days.

(21) Appl. No.: 11/774,181

(22) Filed: Jul. 6, 2007

(65) Prior Publication Data

US 2008/0008426 A1     Jan. 10, 2008

(30) Foreign Application Priority Data

Jul. 7, 2006     (JP) .............. 2006-188269

(51) Int. Cl.
*G02B 6/36* (2006.01)
(52) U.S. Cl. .............. 385/93; 385/53; 385/88; 385/92
(58) Field of Classification Search ........... 385/53, 385/88, 92, 93
See application file for complete search history.

(56) References Cited

U.S. PATENT DOCUMENTS 7,118,293 B2 * 10/2006 Nagasaka et al. ......... 385/89
7,254,301 B2   8/2007 Hoshino et al.

FOREIGN PATENT DOCUMENTS

| JP | 2002-243994 | 8/2002 |
|----|-------------|--------|
| JP | 2003-207694 | 7/2003 |
| JP | 2004-264362 | 9/2004 |
| JP | 2004-361904 | 12/2004 |
| JP | 2005-010334 | 1/2005 |
| JP | 2006-139094 | 6/2006 |

* cited by examiner

*Primary Examiner*—Jennifer Doan
(74) *Attorney, Agent, or Firm*—Harness, Dickey & Pierce, P.L.C.

(57) ABSTRACT

An optical module package that optically couples an optical device and an optical fiber includes: a first surface on which an optical plug that supports one end of the optical fiber is mounted; a second surface that intersects the first surface at an angle less than 90 degrees; a reflection lens formed in the second surface; and an opening section that is located at a position opposing to the second surface, and between the reflection lens and the optical device.

10 Claims, 5 Drawing Sheets

OPTICAL MODULE PACKAGE AND OPTICAL MODULE

The entire disclosure of Japanese Patent Application No. 2006-188269, filed Jul. 7, 2006 is expressly incorporated by reference herein.

BACKGROUND

1. Technical Field

The present invention relates to optical modules that are used for optical communications, and packages used for the modules.

2. Related Art

As a typical example of an optical module that is used for optical communications optical module, an optical module described in Japanese laid-open patent application JP-A-2003-207694 is known. The optical module described in the above document uses a structure in which an optical fiber connector with an array of optical fibers being regularly arranged and bonded thereto is pushed toward a package by a clamp thereby affixing the optical fiber connector to the package.

However, in the optical module described above, the optical fiber connector, the clamp and the package are composed as separate and independent members, such that the work in assembling these members is complex. Also, when an external force (such as, a force to pull up) is applied to the optical fibers, positions between the optical fiber connector, the clamp and the package would likely be shifted from one another, which may lower the optical coupling efficiency.

To solve the problems discussed above, it is conceivable to provide a technique in which an optical module is provided with an optical block built with a lens that optically couples an optical fiber to an optical device.

However, in the technique described above, the optical block is formed from resin, and the resin needs transparency (optical transparency), and high dimensional accuracy is required in processing and assembling the optical block to prevent positional deviations of the lens when mounting (assembling) the optical block. Also, in the example of related art described above, when the optical module is mounted on the package, their positioning needs to be done by guide pins.

Furthermore, when the optical module is bonded to a circuit substrate with solder, thermal load is generated. When the thermal load exceeds the Tg (glass-transition temperature) of the resin, deformation of the resin poses a problem.

SUMMARY

In accordance with an advantage of some aspects of the present invention, it is possible to provide an optical module that facilitates its assembling work through providing a package itself with a lens function, and is capable of suppressing a reduction in the optical coupling efficiency that may be caused by positional misalignment among composing parts. Also, it is possible to provide an optical module that can broaden the range of selection of package materials. Further, by broadening the range of selection of package materials, it is possible to provide a higher performance optical module.

(1) An optical module package in accordance with an embodiment of the invention pertains to an optical module package that optically couples an optical device and an optical fiber, the optical module package including: a first surface on which an optical plug that supports one end of the optical fiber is mounted; a second surface that intersects the first surface at an angle less than 90 degrees; a reflection lens formed in the second surface; and an opening section that is located at a position opposing to the second surface, and between the reflection lens and the optical device. It is noted that the package is a member that integrates composing parts of the optical module in one piece.

According to the structure described above, the reflection lens is provided in the second surface, such that assembly of the optical module becomes easier, and a reduction in the optical coupling efficiency due to positional misalignment among the composing parts can be suppressed. Also, because the optical transparency can be secured by the opening section, the range of selection of package materials can be broadened. Also, materials with high processing accuracy and high heat resistance can be selected, and therefore the performance of the optical module can be improved.

(2) An optical module package in accordance with an embodiment of the invention pertains to an optical module package that optically couples an optical device and an optical fiber, the optical module package including: a first surface on which an optical plug that supports one end of the optical fiber is mounted; a second surface that intersects the first surface at an angle less than 90 degrees; and a reflection lens formed in the second surface, wherein the first surface and the second surface are formed in one piece.

According to the structure described above, the first surface on which the optical plug is mounted and the second surface in which the reflection lens is formed are formed in one piece, such that assembly of the optical module becomes easier, and a reduction in the optical coupling efficiency due to positional misalignment among the composing parts can be suppressed.

The optical module package may preferably be composed of resin. By this structure, the package can be readily molded with the resin.

The resin described above may preferably include filler. By this structure, the processing accuracy and heat resistance property of the package can be improved.

The reflection lens may preferably be composed of a concave section formed in the second surface. By this structure, the second surface can be readily provided with a lens function.

The concave section may preferably be composed of a paraboloid. By this structure, the focusing efficiency of the reflection lens in focusing reflected light can be improved.

The optical module package may preferably have an opening section that is located at a position opposing to the second surface, and between the reflection lens and the optical device. By this structure, the reflection lens and the optical device can be optically coupled to each other through the opening section. Also, because the optical transparency can be secured by the opening section, the range of selection of package materials can be broadened. Also, materials with high processing accuracy and high heat resistance capability can be selected, and therefore the performance of the optical module can be improved.

Preferably, the optical module package may further have a storage section for storing the optical device at a position corresponding to the opening section. By this structure, the optical coupling of the reflection lens and the optical device through the opening section can be more readily made.

Preferably, the optical module package may further have a storage section for storing the optical device at a position corresponding to the opening section, and a storage section for storing an IC chip that is connected to the optical device at a back surface of the first surface. By this structure, the IC chip can be effectively implemented into a module.

(3) An optical module in accordance with an embodiment of the invention includes the optical module package described above.

(4) An optical module in accordance with an embodiment of the invention pertains to an optical module that is disposed on a substrate, the optical module having an optical plug that supports one end of an optical fiber; a package having a first surface on which the optical plug is mounted, a second surface that intersects the first surface at an angle less than 90 degrees, a reflection lens formed in the second surface, and an opening section that is located at a position opposing to the second surface; an optical device optically coupled to the second surface through the opening section; and an IC chip disposed at a back surface of the first surface.

According to the structure described above, the reflection lens is provided in the second surface that composes the package, such that assembly of the optical module becomes easier, and a reduction in the optical coupling efficiency due to positional misalignment among the composing parts can be suppressed. Also, the reflection lens and the optical device can be optically coupled to each other through the opening section. Furthermore, because the optical transparency can be secured by the opening section, the range of selection of package materials can be broadened. Also, materials with high heat resistance can be selected, and therefore the performance of the optical module can be improved. Also, by the structure described above, the optical device and the IC chip can be effectively formed into a module.

Preferably, the optical module described above may further include a ceramic package having a first storage section for storing the optical device and a second storage section for storing the IC chip, wherein the ceramic package may be disposed with the first storage section corresponding to a back surface of the first surface, and the second storage section corresponding to the opening section. By this structure, the IC chip and the optical device can be sealed up.

Preferably, the optical module may further have an optically transparent member that covers the second storage section. By this structure, the optical device can be sealed up by the ceramic package (the second storage section) and the optically transparent member, such that the damp-proof property for the optical device can be improved.

The optical plug may preferably have a focusing lens on an optical path for optically coupling the optical device with an optical fiber, wherein the focusing lens is larger than a projection area of the reflection lens at a disposing plane where the focusing lens is disposed. By this structure, light reflected by the reflection lens can be effectively focused by the focusing lens.

DESCRIPTION OF EXEMPLARY EMBODIMENTS

Preferred embodiments of the invention are described below with reference to the accompanying drawings. It is noted that members having the same functions shall be appended with the same or related reference numbers, and their descriptions shall not be repeated.

Figure 1:
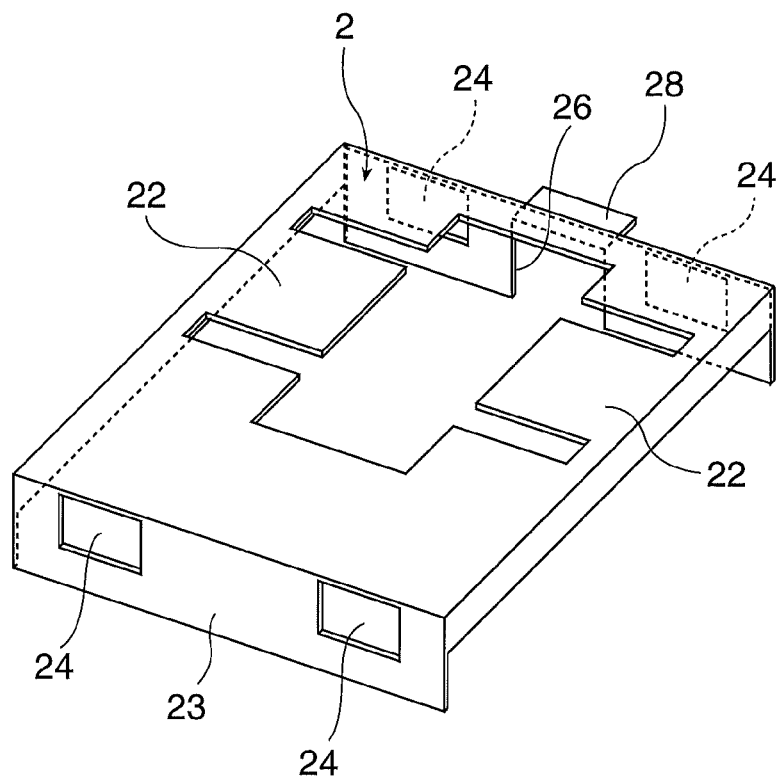
FIG. 1 is a perspective view of a clamp 2 of an optical module in accordance with an embodiment of the invention.
Figure 2:
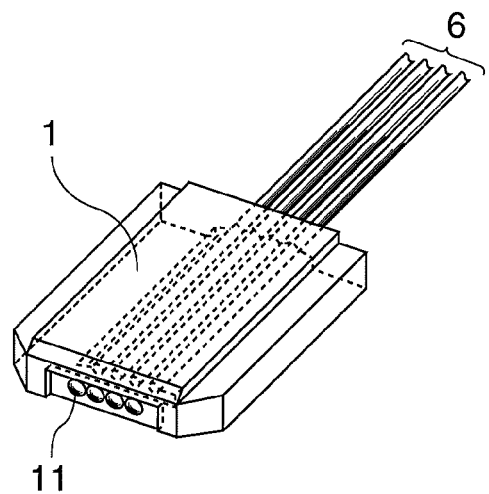
FIG. 2 is a perspective view of an optical plug 1 of the optical module in accordance with the present embodiment.
Figure 3A:
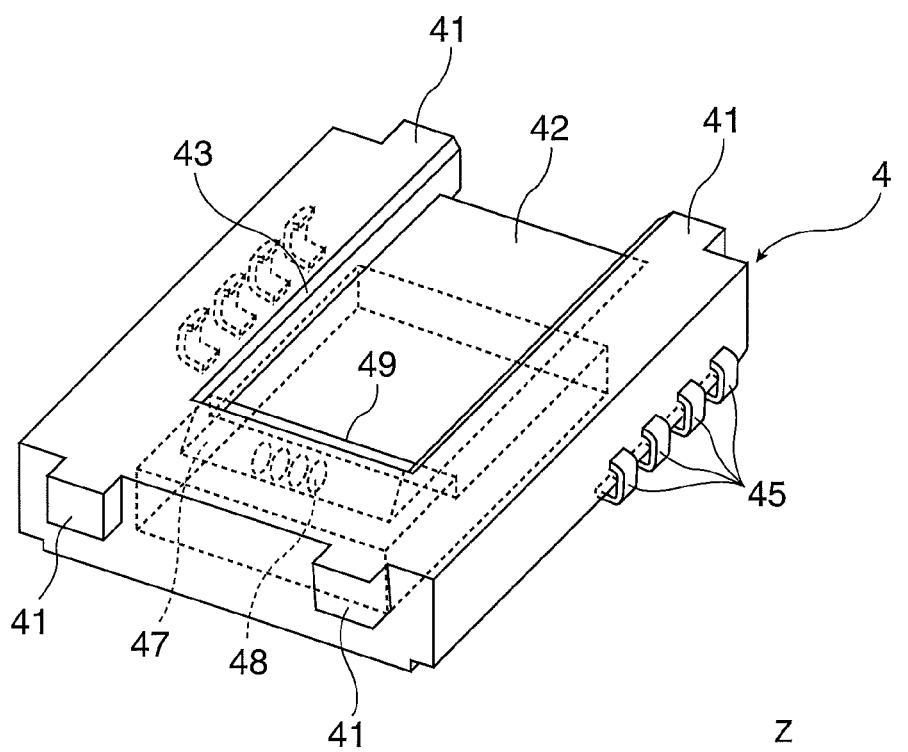
FIGS. 3A and 3B are perspective views of a resin package 4 of the optical module in accordance with the present embodiment.
Figure 3B:
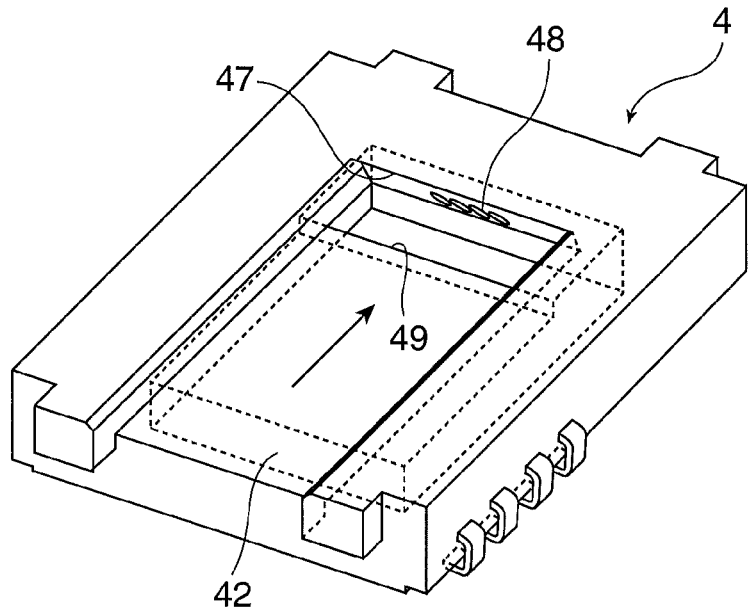
Figure 4A:
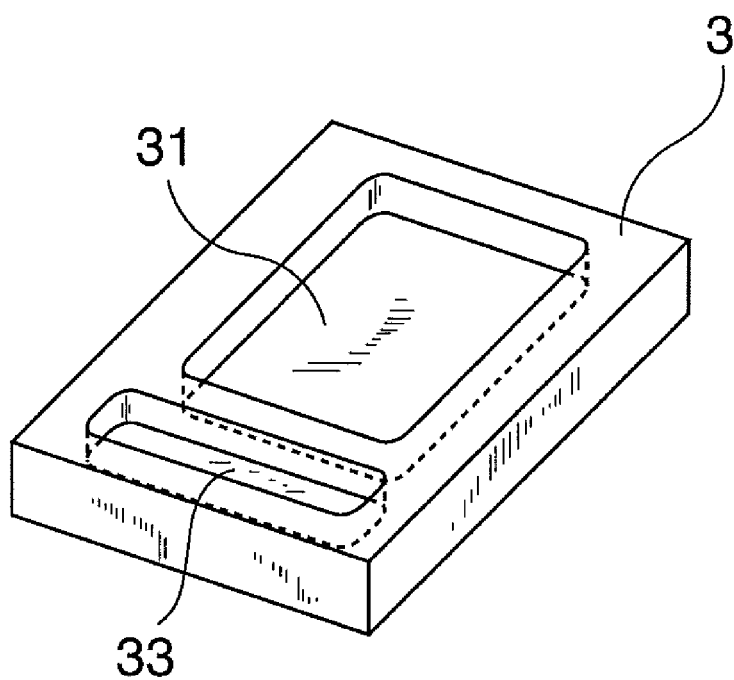
FIGS. 4A and 4B are perspective views of a ceramic package 3 of the optical module in accordance with the present embodiment.
Figure 4B:
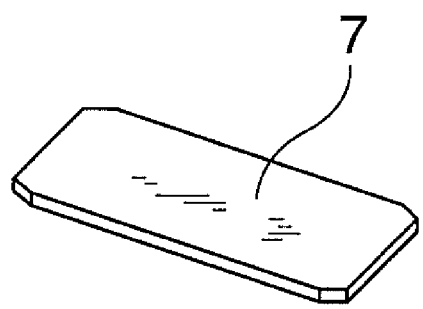
Figure 5:
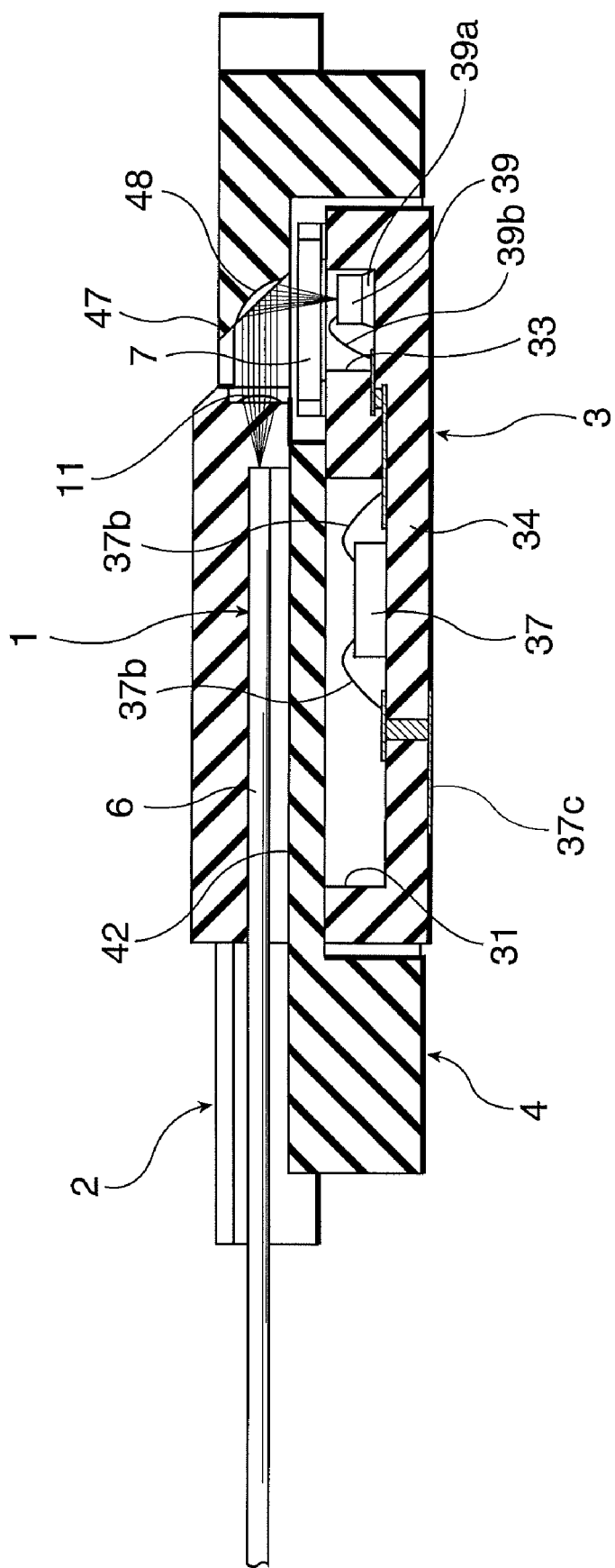
FIG. 5 is a cross-sectional view of the optical module in accordance with the present embodiment.
Figure 6:
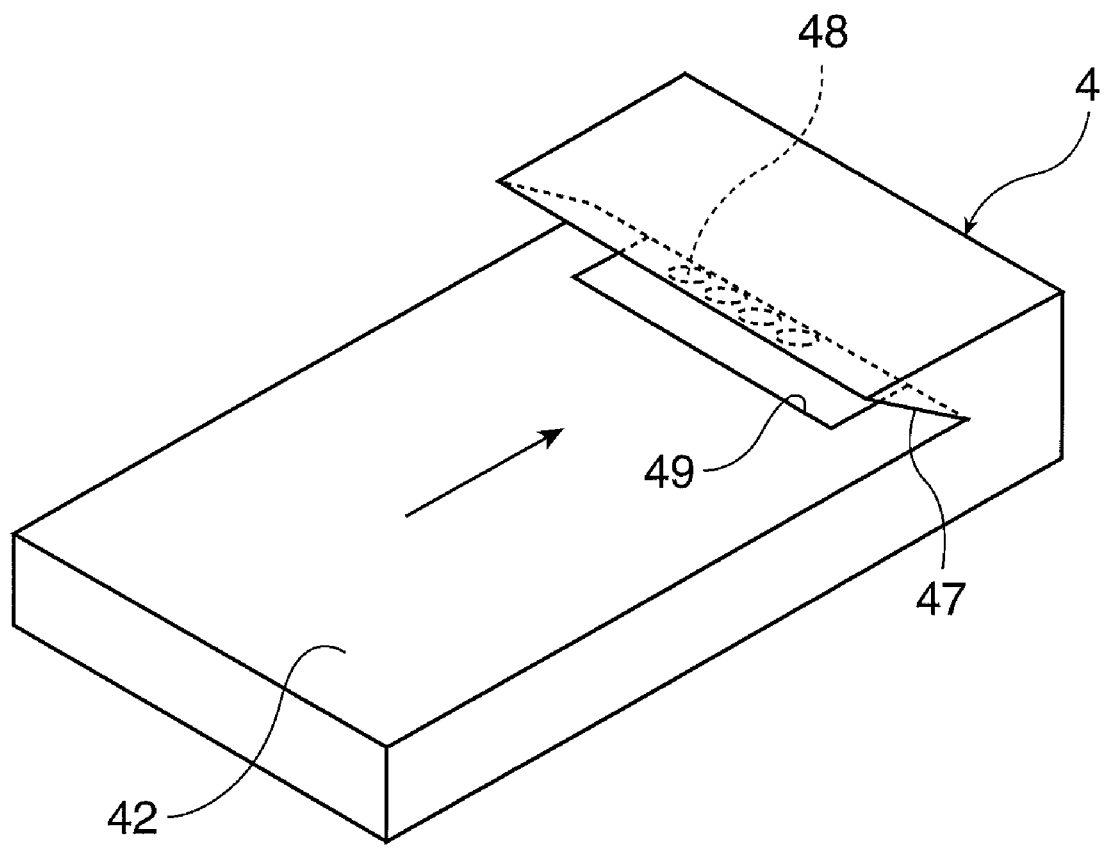
FIG. 6 is a schematic perspective view of a main portion of the resin package 4 of the optical module in accordance with the present embodiment.

FIGS. 1-5 are exploded perspective views of an optical module in accordance with an embodiment of the invention. More specifically, the optical module in accordance with the present embodiment includes a clamp 2, an optical plug 1, a resin package 4 and a ceramic package 3. FIG. 1 is a perspective view of the clamp 2, FIG. 2 is a perspective view of the optical plug 1, FIG. 3A is a perspective view of the resin package 4, and FIG. 3B is a perspective view of the resin package 4 viewed from an opposite direction with respect to the X direction. FIGS. 4A and 4B are perspective views of the ceramic package 3. FIG. 5 is a cross-sectional view of the optical module in accordance with the present embodiment, which shows a cross section thereof taken along the X direction (see FIG. 3) about the center section of the optical module in the Y direction, when the composing members are assembled. Also, FIG. 6 is a perspective view schematically showing a main portion of the resin package 4 of the optical module in accordance with the present embodiment. It is noted that the optical plug 1 and the clamp 2 jointly form a plug unit, and the ceramic package 3, the resin package 4 and the optical block 5 jointly form a receptacle unit.

As shown in FIG. 2, the optical plug 1 supports one end of an optical fiber 6. The optical plug 1 may be formed by, for example, resin injection molding. The optical plug 1 has V-letter shaped grooves and a plate member that covers the grooves. One ends of the optical fibers 6 are disposed in the V-letter shaped grooves, and the ends of the optical fibers are pressed by the plate member, thereby supporting the optical fibers 6. Also, the optical plug 1 has a focusing lens 11 disposed on an optical axis of the optical fiber 6. In the example shown in the figure, a plurality of focusing lenses 11 are provided at one end side of the optical plug 1 in its longitudinal direction. The focusing lens 11 may preferably be greater than a projection area of a parabolic reflection lens 48 at a disposing plane at which the focusing lens 11 is disposed, to be described below in greater detail.

As shown in FIG. 1, the clamp 2 is disposed in a manner to surround the entire body of the receptacle unit, thereby joining the optical plug 1 and the receptacle unit in one piece. The clamp 2 may be formed, for example, from a metal plate that is punched out and bent by a press machine. The clamp 2 is equipped with leaf springs 22, a light shield section 23, engagement holes 24, a window section 26, and a fiber guide section (an eaves section) 28.

The leaf springs 22 may be formed through cutting an upper surface side of the clamp 2 in a generally H-letter shape. The leaf springs 22 hold a protruded section in an upper surface (the top surface) of the optical plug 1 extending in its longitudinal direction at both sides thereof, and force end sections of the protruded section toward a mounting surface 42 of the resin package 4. By this, the optical plug 1 is brought in tight contact with the resin package 4.

The light shield section 23 is disposed at a tip end side of the clamp 2, in a manner to intersect the optical axis of the optical fiber 6. The light shield section 23 is a plate portion formed by bending a portion of the clamp 2 as illustrated. The light shield section 23 prevents laser light emitted from the optical plug 1 from leaking outside, when the plug unit is not coupled with the receptacle unit.

The engagement holes 24 are provided in plate portions that are formed by bending portions of the clamp 2 at its front and rear end sides. In the present example, two engagement holes 24 are provided at the front and rear, respectively. More concretely, the engagement holes 24 are provided in the plate sections near both ends thereof, and the light shield section 23 and the window section 26 are provided between them, respectively. The engagement holes 24 function to retain the receptacle unit and the plug unit in one piece by engaging with four engaging pins (protruded sections) 41 provided on the resin package 4, respectively.

The fiber guide section 28 is formed by bending a portion of the plate portion of the clamp 2 at its rear end side. The fiber guide section 28 in the present example is interposed between the two engagement holes 24 generally at the center of the rear end side of the clamp 2. When the optical plug 1 is fitted in the clamp 2, the optical fiber 6 is disposed in a manner to pass through the window section 26, and guided by the fiber guide section 25. For example, the optical fiber 6 and the fiber guide section 25 may be affixed to each other with adhesive.

The ceramic package 3 is formed with ceramic material, and is equipped with a box shaped member 34 (see FIG. 4A) having a recessed section (storage section) 33 for disposing an optical device 39 and a recessed section (storage section) 31 for disposing an IC chip (a circuit chip, a driver IC) 37, and a glass plate (an optically transparent member, a transparent member) 7 that is disposed on the upper side of the box shaped member 34 in a manner to cover the recessed section 33, in other words, cover over the optical device 39 (see FIG. 4B). It is noted that, in FIG. 4A, illustration of the IC chip 37 and the optical device 39 to be stored inside is omitted.

Also, as shown in FIG. 5, the optical device 39 is bonded to the bottom section of the recessed section 33 with silver paste 39a, and the IC chip 37 is bonded to the bottom section of the recessed section 31 with silver paste or the like (not shown). Also, a wiring layer (not shown) to be described below is provided at the bottom section of the recessed section 33, and the wiring layer and surface electrodes of the optical device 39 are connected with bonding wires 39b. Also, a wiring layer (not shown) is provided at the bottom section of the recessed section 31, and the wiring layer and surface electrodes of the IC (integrated circuit) chip 37 are connected with bonding wires 37b.

As described above, the optical device 39 is sealed up by the box shaped member (the recessed section 33) 34 and the transparent plate (glass plate) 7. The glass plate 7 may be affixed onto the box shaped member 34 with adhesive. It is noted that the glass plate 7 may be extended to cover the recessed section 31, in other words, the IC chip 37. Also, the glass plate 7 may be omitted. However, in order to improve the damp-proof property for the optical device 39, the glass plate 7 may preferably be disposed in a manner to cover at least the recessed section 33.

Also, at the bottom section of the box shaped member 34, a plurality wiring layers and via holes for connecting these wiring layers are formed (see FIG. 5). The topmost layers among the wiring layers are exposed at the bottom surfaces of the recessed sections 31 and 33, and the lowermost layers among the wiring layers are exposed as electrodes 37c at the back surface of the box shaped member 34.

The optical element 39 may be a light emission element (for example, a VCSEL) that outputs optical signals, or a photodetecting element that detects optical signals. The optical element 39 is disposed with its optical axis being generally perpendicular to the glass plate 7, and outputs optical signals or receives optical signals through the glass plate 7 (see FIG. 5).

The IC chip 37 may have a built-in driver that drives the optical device 39, when the optical device 39 is a light emission element; and may have a built-in amplifier that amplifies electrical signals outputted from the optical device 39, when the optical device 39 is a photodetecting element. In the present example as shown in FIG. 5, the optical device 39 and the circuit chip 37 are connected to each other by bonding wires 37b and 39b and the wiring layers described above.

As shown in FIG. 3, the resin package 4 is equipped with a function to support the optical plug 1 and a lens function. For example, the resin package 4 has a mounting surface (first surface) 42 on which the optical plug 1 is mounted, and guide surfaces 43 located on both sides of the mounting surface 42 and generally orthogonal to the mounting surface 42. Therefore, the optical plug 1 is supported and positioned by these surfaces.

Furthermore, the resin package 4 has a sloped surface (second surface) 47 that intersects the mounting surface 42 at an angle less than 90 degrees, and a parabolic reflection lens 48 is formed in the sloped surface 47. In other words, a concave section is formed in the sloped surface 47, wherein the curved surface composing the concave section defines a paraboloid (in a parabolic shape). In this manner, because the parabolic reflection lens 48 is provided in the resin package 4, in other words, the mounting surface 42 and the parabolic reflection lens 48 are formed in one piece, assembly of the optical module becomes easier, and a reduction in the optical coupling coefficient by positional misalignments among the composing parts can be suppressed. The parabolic reflection lens 48 may be provided with a metal film formed on its surface by a sputter method or a vapor deposition method in order to improve the reflectivity of the reflection lens.

Furthermore, the resin package 4 is provided with an opening section 49 at a position below the parabolic reflection lens 48 and opposing to the sloped surface 47, and between the parabolic reflection lens 48 and the optical device 39 (see FIG. 3 and FIG. 6). In this example, the opening is provided in a generally vertical direction from the parabolic reflection lens 48, and the optical device 39 is disposed below the opening section 49. As a result, an optical path (an optical connection) is secured between the optical device 39 and the parabolic reflection lens 48. In other words, the storage section for storing the optical device 39 is provided below the opening section 49 of the resin package 4. In this manner, because the resin package 4 is provided with the opening section 49, the optical transparency is secured, such that the range of selection of package materials (resin) can be broadened. Also, materials with high processing accuracy and high thermal resistance property can be selected, such that the performance of the optical module can be improved. It is noted that, in FIG. 6, illustration of the recessed section in the back surface opposite to the mounting surface 42 (a storage section for storing the ceramic package 3) and the protruded sections at an outer circumference of the back surface is omitted. Such a recessed section is not essential, and for example, the ceramic package 3 may be directly adhered to the back surface opposite to the mounting surface 42. Also, in FIG. 6, illustration of protrusions including the guide surfaces 43 on both sides of the mounting surface 42 is omitted. The protrusions (the guide surfaces 43) may neither be essential, and for example, other methods may be used for positioning and affixing.

Also, the IC chip 37 is disposed at the back surface of the resin package 4 opposite to the mounting surface 42. In other words, a storage section for storing the IC chip 37 is provided at the back surface of the resin package 4 opposite to the mounting surface 42. In other words, in the back surface of the resin package 4 (the surface on the opposite side of the surface where the optical plug 1 is mounted) is formed a recessed section at which the ceramic package 3 is to be joined (see FIG. 5), and the ceramic package 3 is positioned such that the optical device 39 in the recessed section 33 of the ceramic package 3 is disposed at a position opposing to the sloped surface (parabolic reflection lens 48) 48 and below the opening section 49, and the IC chip 37 in the recessed section 31 is disposed at the back of the mounting surface 42. These packages may be joined with adhesive, solder or the like.

Furthermore, the resin package 4 is equipped with the engaging pings 41 described above and a plurality of lead electrodes 45, and as described above, can be joined with the clamp 2 by the engaging pins 41. Also, the resin package 4 can be joined with a circuit substrate to be described below by the lead electrodes 45.

The resin package 4 may be fabricated by, for example, transfer molding with thermosetting type resin such as epoxy resin. More concretely, the resin package 4 can be formed through injecting melted resin in a metal mold having the externals of the resin package 4, hardening the resin, and separating the metal mold from the hardened resin. In particular, fabrication of the parabolic reflection lens 48 requires highly accurate processing. Accordingly, after a first forming process, a second forming process (re-processing) may be conducted to form a desired lens curve. For a highly accurate second forming process, for example, polishing and cutting may be conducted. Also, by forming a concave section (parabolic reflection lens) in a resin member having a sufficient thickness, its processing accuracy and lens characteristics can be improved.

Also, in this resin package 4, the opening section 49 is formed, thereby securing an optical path between the optical device 39 and the parabolic reflection lens 48. Accordingly, optically transparent (transparent) resin does not need to be used, such that the range of selection of package materials (resin) can be broadened.

Therefore, resin with excellent thermal resistance and workability can be selected. Thermoplastic resins, such as, for example, liquid crystal polymer, PSP (polyphenylene sulfide), and PEEK (polyetherether ketone) may be used. Tg of some of the aforementioned resins may exceed the soldering temperature (about 260° C.) on the optical module, but the package can be prevented from being deformed during the soldering step (by thermal load).

Also, the resin may contain filler. The filler is particulate or powdery substance to be added in the resin to improve the strength and functionality and lower the cost. For example, filler composed of silica may be added in the resin, whereby changes in the modulus of elasticity by changes in temperature can be reduced, and its thermal resistance can be improved. Also, mold shrinkage (shrinkage occurring when hardening the resin) can be reduced, and the processing accuracy and dimensional accuracy can be improved.

Also, the resin package 4 is formed in one piece with the parabolic reflection lens 48. Therefore, by improving the processing accuracy and dimensional accuracy, the optical coupling efficiency between the optical fiber 6 and the optical device 39 can be improved.

The optical plug 1 is mounted on the mounting surface 42 of the resin package 4, and the resin composing the sloped surface (light reflection surface) 47 formed at an intersection between the optical axis of the optical device 39 and the optical axis of the optical fiber 6 is processed to form a concave section, thereby providing a lens function. Furthermore, the optical device 39 is disposed at a position opposing to the sloped surface (parabolic reflection lens 48) 47 through the opening section (glass plate 7) 49. In other words, the optical path of the optical fiber 6, the parabolic reflection lens 48 and the optical device 39 is secured.

Accordingly, for example, an optical signal emitted from the optical device 39 is reflected and focused by the parabolic reflection lens 48, and enters one end of the optical fiber 6 (see FIG. 5). Also, an optical signal emitted from the optical fiber 6 is reflected and focused by the parabolic reflection lens 48, and reaches the optical device 39 (see FIG. 5). In this instance, as the lens curve is formed to be a paraboloid, the optical signal (output light) emitted from the optical fiber 6 can be formed into a parallel beam. Therefore, the light focusing efficiency of the optical plug 1 at the focusing lens 11 can be improved.

The apex of the paraboloid is made coincident with the origin of an XYZ space (see FIG. 3), and a cross section in the XZ plane is observed. When the shape on that plane is defined by a parabola of $4pX=Z^2$, a light emission point or a light detecting point (X, Z) on the optical device 39 may preferably be disposed at (p, 0).

Also, in order to effectively focus the reflected light of the parabolic reflection lens 48, the focusing lens 11 of the optical plug 1 may preferably be made greater than a projection area of the parabolic reflection lens 48 at a disposing surface at which the focusing lens 11 is disposed (for example, a surface perpendicularly intersecting the optical fiber 6).

The plural lead electrodes 45 are provided with a part thereof enclosed by the resin package, and in a manner to protrude toward the lower surface that is to be opposed to the circuit substrate of the resin package 4. In the present embodiment, four lead electrodes 45 are provided on each of the sides of the resin package 4 along its longitudinal direction. Also, in accordance with the present embodiment, the lead electrodes 45 are not used for securing electrical connection, but instead used for joining and affixing the resin package 4 onto the circuit substrate. It is noted however that the lead electrodes 45 may also be used to secure electrical connection.

Next, a mounting state in which the optical module is mounted on the circuit substrate is described. For example, the electrodes 37c of the ceramic package 3 are provided on a surface (a surface in parallel with the XY plane) that extends in parallel with the extending direction of the optical fiber 6 that is mounted on the optical module. Also, the electrodes 37c are electrically connected and mechanically affixed to connection pads or the like on the circuit substrate through solder.

Each of the lead electrodes 45 of the resin package 4 is formed in a generally L-letter shape as shown in FIGS. 3A and 3B, and provided along the side surface and the lower surface 46 of the resin package 4. Also, as shown in FIGS. 3A and 3B in dotted lines, a portion of the lead electrode 45 is included in the resin package 4. As shown in FIGS. 3A and 3B, each of the lead electrodes 45 is mechanically affixed to a connection pad or the like on the circuit substrate through solder at the portion of the lead electrode protruding on the lower surface 46 of the resin package 4.

In the present embodiment, each of the lead electrodes 45 is provided on a side surface (a surface in parallel with the XY plane) that extends in parallel with the extension direction of the optical fiber 6 that is mounted on the optical module of the resin package 4. Also, the lead electrodes 45 are arranged along the X direction (first direction) that is generally in parallel with the extension direction of the optical fiber 6. Also, the lead electrodes 45 are provided on each of side surfaces disposed on both sides with the extension direction of the optical fiber 6 generally being at the center. By narrowing the mutual gap among the lead electrodes 45 (for example, to about 0.8 mm), the stress caused by a difference in the thermal expansion coefficient between the lead electrodes 45 and the circuit substrate after having been joined together can be alleviated.

For example, solder paste may be coated on the top surfaces of the connection pads that are provided on the circuit substrate, the connection pads and the lead electrodes 45 are aligned with one another, and the optical module is mounted on the circuit substrate. Then, the circuit substrate and the optical module are passed through a reflow furnace thereby melting the solder. By this, the electrodes 37c and the connection pads, and the lead electrodes 45 and the connection pads are joined together, respectively.

In this instance, thermal load is generated. However, in accordance with the present embodiment, resin with sufficient thermal resistance can be used for the resin package 4, such that deformation of the resin package 4 and its thermal stress can be reduced.

Also, by electrically connecting the electrodes 37c of the ceramic package 3 directly with a substrate such as a circuit substrate or the like, as described above, transmission loss due to impedance mismatching can be reduced. Also, by using a lead frame, problems in the joining strength that may be caused by a difference in thermal expansion coefficient can be suppressed.

It is noted that the invention is not limited to the details of the embodiment described above, and many modifications can be made and implemented within the scope of the subject matter of the invention. For example, in the embodiment described above, an example in which resin is used as the material of the package 4, but other materials may be used to form the package. However, resins excel in workability, and therefore the use thereof is suitable. Also, in accordance with the present embodiment, the mounting surface 42 and the parabolic reflection lens 48 (sloped surface 47) are formed in one piece. However, an independent member (resin) having the parabolic reflection lens 48 formed thereon may be bonded to a package having the mounting surface 42. However, a package having the mounting surface 42 and the parabolic reflection lens 48 formed in one piece excels in alignment accuracy. Also, in accordance with the present embodiment, the opening section 49 is provided in the resin package 4. However, when the resin package 4 has optical transparency, the opening section 49 does not need to be provided. However, as described above, by providing the opening section 49, the effects described above, such as, a broadened range of selection of resins, can be achieved. Also, in accordance with the present embodiment, as an example of the package that stores an optical device and the like, a ceramic package is described. However, the package is not limited to the example described above, and any one of packages in different modes and different materials having similar structure and function can also be used.

What is claimed is:

1. An optical module package that optically couples an optical device and an optical fiber, the optical module package comprising:
    a first surface on which an optical plug that supports one end of the optical fiber is mounted, the first surface extending in the direction of an optical axis of the optical fiber;
    a second surface disposed along the optical axis and facing the optical fiber, that intersects the first surface at an angle less than 90 degrees;
    a reflection lens formed in the second surface;
    an opening section that is located at a position opposing to the second surface, and between the reflection lens and the optical device such that an optical path is secured between the reflection lens and the optical device, and
    a storage section for storing the optical device at a position corresponding to the opening section, and a storage section for storing an IC chip that is connected to the optical device at a back surface of the first surface.

2. An optical module package according to claim 1, being composed of resin.

3. An optical module package according to claim 2, wherein the resin includes filler.

4. An optical module package according to claim 1, wherein the reflection lens is composed of a concave section formed in the second surface.

5. An optical module package according to claim 4, wherein the concave section is composed of a paraboloid.

6. An optical module package according to claim 1, further comprising a storage section for storing the optical device at a position corresponding to the opening section.

7. An optical module comprising the optical module package recited in claim 1.

8. An optical module that is disposed on a substrate, the optical module comprising:
    an optical plug that supports one end of an optical fiber;
    a package including:
        a first surface on which the optical plug is mounted, the first surface extending in the direction of an optical axis of the optical fiber;
        a second surface disposed along the optical axis and facing the optical fiber, that intersects the first surface at an angle less than 90 degrees;
        a reflection lens formed in the second surface; and
        an opening section that is located at a position opposing to the second surface;
    an optical device optically coupled to the second surface through the opening section;
    an IC chip disposed at a back surface of the first surface; and
    a ceramic package having a first storage section for storing the optical device and a second storage section for storing the IC chip, wherein the ceramic package is disposed with the first storage section corresponding to a back surface of the first surface, and the second storage section corresponding to the opening section.

9. An optical module according to claim 8, further comprising an optically transparent member that covers the second storage section.

10. An optical module according to claim 8, wherein the optical plug has a focusing lens on an optical path for optically coupling the optical device with an optical fiber, and the focusing lens is larger than a projection area of the reflection lens at a disposing plane where the focusing lens is disposed.

* * * * *